United States Patent [19]

Liu et al.

[11] Patent Number: 5,139,927
[45] Date of Patent: Aug. 18, 1992

[54] PERMANENT YELLOW IMAGED LIGHT MODULATING FILM

[75] Inventors: Kou-Chang Liu, Wayne, N.J.; David F. Lewis, Monroe, Conn.; John C. Hornby, Rutherford, N.J.

[73] Assignee: ISP Investments Inc., Wilmington, Del.

[21] Appl. No.: 601,533

[22] Filed: Oct. 23, 1990

[51] Int. Cl.$^5$ .......................... G03C 1/00; G03C 1/72
[52] U.S. Cl. .................... 430/346; 430/270; 430/281; 430/286; 430/287; 430/945
[58] Field of Search .............. 430/286, 288, 346, 281, 430/270, 945, 287; 526/285

[56] References Cited

U.S. PATENT DOCUMENTS

| | | | |
|---|---|---|---|
| 3,723,121 | 3/1973 | Hauser | 430/20 |
| 3,772,028 | 11/1973 | Fico et al. | 430/495 |
| 4,215,208 | 7/1980 | Yee et al. | 526/285 |
| 4,297,470 | 10/1981 | Osada et al. | 526/304 |
| 4,474,807 | 10/1984 | Gerhardt et al. | 514/478 |
| 4,536,473 | 8/1985 | Mihara | 430/575 |
| 4,649,100 | 3/1987 | Leyrer et al. | 430/326 |
| 4,678,736 | 7/1987 | Hanamura et al. | 430/270 |
| 4,684,688 | 8/1987 | Moskowitz | 524/336 |
| 4,705,742 | 11/1987 | Lewis | 430/333 |
| 4,753,861 | 6/1988 | Tsou et al. | 430/19 |
| 4,863,832 | 9/1989 | Saitoh et al. | 430/281 |
| 4,889,793 | 12/1989 | Taniguchi | 430/284 |
| 5,004,671 | 4/1991 | Nishimura et al. | 430/286 |

*Primary Examiner*—Charles L. Bowers, Jr.
*Assistant Examiner*—John A. McPherson
*Attorney, Agent, or Firm*—Marilyn J. Maue; Joshua J. Ward

[57] ABSTRACT

This invention relates to the preparation of a supported modulating film having a permanent yellow imaged layer of the homopolymer of a crystalline diacetylene cinnamate monomer

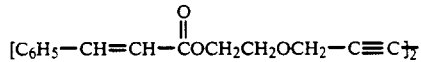

and to the use of said film as a light modulator in the production of master printing plates or printed circuit boards.

3 Claims, No Drawings

PERMANENT YELLOW IMAGED LIGHT MODULATING FILM

In one aspect the invention relates to a permanent yellow imaged modulating or printing plate master film for improved negative image transfer by energy generated from a blue light source to a image receiving photoresist having a coating which is sensitive to blue light. In another aspect the invention relates to the preparation of said modulating film by a non-chemical process.

BACKGROUND OF THE INVENTION

Of the various light sources suitable for photoimaging including red, green and blue, blue light is the most economical and efficient. In general, the process of preparing a master printing plate having a photoresist layer involves passing energy from a light source through non-imaged portions of a modulator, e.g. a film imaged in a color which absorbs the transmitted light and transmits light radiation passing through non-imaged areas to the printing plate coated with a material which is imageable in discrete exposed areas upon exposure to radiant energy. Because of the ready availability and economy of blue light energy sources and the numerous films which are sensitive to blue light, extensive research has been directed to finding compounds which are imageable to a permanent yellow hue since such imaged compounds most efficiently absorb blue light and provide the highest duplicating properties. A yellow imaged modulating film would be capable of transferring energy from its non-imaged areas in a negative configuration of its pattern to a printing plate having a photoresist layer whereupon the photoresist layer develops color, is polymerized or depolymerized in the negative pattern dictated by the modulating film in the highest degree of acuity. Accordingly, a negative or positive of the desired image can be developed on the printing plate depending upon the yellow pattern or design inscribed on the modulating or master film.

Polyacetylenic compounds have enjoyed great popularity in imaging processes. However, it is well recognized that thermochromic behavior of polyacetylenic compounds is unpredictable and has been found only in certain narrow classes of this species. Further, within these classes, formation of a permanent yellow hue is extremely rare.

While a few polyacetylenic monomers are capable of providing a yellow image at excessively high temperatures, this thermochromic effect is ephemeral, so that upon cooling, the image reverts to an initial transition color of darker shades e.g. red, blue, bronze, etc. (U.S. Pat. No. 3,501,303). Such color reversible compounds are useful as temperature or time-temperature indicators dependent on thermal changes but are not practical for use as modulating films in the preparation of printing plates, circuit boards and the like.

Accordingly, it is an object of this invention to provide a permanent yellow imaged film for use as a reverse image transmitting agent or master film in the production of printing plates and circuit boards.

Another object is to provide a commercially acceptable and economical chemically processless method for preparation of a permanent yellow imaged film.

Another object is to provide a commercially acceptable and economical process for using a permanent yellow imaged recording film as a master film in the production of printed circuit boards or master printing plates.

These and other objects of the invention will become apparent from the following description and disclosure.

THE INVENTION

In accordance with this invention there is provided a process which comprises exposing a supported layer of colorless, crystalline polyacetylene cinnamate monomer having the formula

to short wavelength radiation in order to polymerize the monomer to a magenta colored homopolymer and subjecting the resulting homopolymer layer to radiation at a longer wavelength from laser emissions, preferably focused to impinge discrete areas of the homopolymer in a predetermined pattern or design so as to form a permanent yellow image thereon. The laser operating at the longer wavelength is one having sufficient beam power to directly or indirectly generate heat of at least 50° C., preferably between about 50° and about 150° C., in the exposed portions of the homopolymer. Laser emissions in a wavelength of 575 nm or less are directly absorbed by the homopolymer. However, the emissions of lasers generating energy in wavelengths above 575 nm are not absorbed; accordingly, in these cases an energy absorbing, heat transmitting agent is employed in conjunction with the diacetylene cinnamate monomer in the preparation of the initial film before coating on a substrate.

The colorless crystalline diacetylene cinnamate monomer employed herein is prepared by the transesterification of trans-methyl cinnamate with 2-(propargyl) ethanol to form 2-(propargyl) ethyl cinnamate. The acetylenic cinnamate ester in an inert solvent is then reacted by oxidative coupling with oxygen at a temperature of about 40-45° C. in the presence of cuprous chloride in the presence of a tertiary amine, e.g. tetramethyl ethylene diamine, as a catalyst.

The resulting diacetylene cinnamate monomer product is recovered by precipitation, washing with aqueous HCl and water and crystallization whereupon it is suitable for use as or in a coating composition applied to a substrate. The monomer is applied to the substrate in a coating thickness of from about 0.002 to 100 um, preferably from about 0.01 to about 5 um. Suitable substrates include polyethylene terephthalate, nylon, polystyrene, cellulose acetate, cellulose nitrate, cellophane, polyvinyl chloride, polyvinylidene chloride, teflon, polychlorotrifluoroethylene, polypropylene, paper, ceramic, glass, metal, wood and the like, however, for use as a modulating film, a transparent substrate is recommended.

Coatings of the present diacetylene cinnamate monomer in the presence or absence of an energy absorbing, heat transmitting agent, are applied to a substrate by any of the known techniques, including applications of crystalline dispersions or of one or more monomolecular layers; however, an aqueous dispersion of crystals fixed with any of the known binders is preferred. One or more monomolecular layers of the diacetylene cinnamate compound applied to the substrate by the Langmuir-Blodgett technique, spin or spray coating method is also suitable. Any energy absorbing, heat transmitting agent, which in certain situations may be required, can be applied as a separate, contiguous layer. The preparation of useful binder dispersions and coating techniques are more particularly described in my copending U.S. patent application, Ser. No. 07/601,499*, now U.S. Pat. No. 5,095,134. By way of illustration, a dispersion, emulsion or suspension of the crystalline polyacetylene cinnamate/binder, preferably an aqueous dispersion with a binder, is prepared under atmospheric conditions by mixing the crystalline diacetylene cinnamate crystals in a binder solution optionally containing an energy absorbing, heat transmitting agent, until a uniformly dispersed, suspended or emulsified liquid mixture is obtained. The mixture is then processed by known procedures e.g. chilled or frozen by the process described in U.S. Pat. No. 4,784,934 to provide a dispersion of microcrystals in a binder. The diacetylene cinnamate crystals have a diameter of from about 0.02 um to about 5 um, preferably from 0.1 um to 1.0 um, and are fixed in the binder to provide a uniform dispersion containing from about 1 to about 50 wt %, preferably from about 4 to about 15 wt. % of solid microcrystals. This dispersion is then coated on a substrate and dried to form a layer of between about 0.3 to about 10, preferably 0.5 to 5 um thickness. Monomolecular layers of the diacetylene cinnamate are, of course, much thinner; however a plurality of monomolecular layers as well as one or more layers of the energy absorbing component, when needed, can be sequentially applied to any thickness desired.

*entitled POLYACETYLENE POLYETHERS, filed concurrently herewith

The resulting dried diacetylene cinnamate film is then imaged by the process of this invention which comprises, in a first stage of a preferred two stage process, exposing the film, at ambient temperature and pressure to short wavelength radiation; i.e. at a wavelength of between about 200 and about 350 nm, to instantly polymerize the diacetylene cinnamate to a magenta colored homopolymer. Short wavelength exposure is effected by conventional techniques using a xenon flash lamp, mercury arc lamp, mercury xenon arc lamp, tungsten quartz halogen lamp, electron beam, UV light, actinic light, gamma-rays, X-rays, beta-rays, neutrons, alpha-particles, or UV laser, e.g. an argon ion laser transmitting energy at about 275 nm wavelength, a krypton ion laser, a GaAlP laser and the like. The short wavelength exposure can be employed to homopolymerize all or a portion of the diacetylene cinnamate film, that is a broad beam of UV light can be used to homopolymerize the entire colorless diacetylene cinnamate layer (case a) or the layer can be scribed in one or several steps to define a predetermined pattern or image with a short wavelength transmitting device e.g. a UV laser or electron beam operated in the writing mode, (case b). In case (a), the entire film acquires the magenta color of the homopolymer; whereas in case (b) a homopolymerized magenta image is inscribed on the colorless background of the unexposed diacetylene cinnamate. The UV laser which is employed in case (a) and/or case (b) has an output power of between about 1 mW and about 100 W with an effective dwell time of from about 0.01 second to about 5 minutes. Exposure with an electron beam is carried out under vacuum of from about $10^{-3}$ to about $10^{-9}$ torr, preferably from about $10^{-5}$ to about $10^{-8}$ torr, using a beam diameter of from about 0.1 to about 25 $\mu$m, an energy of from about 10 to about 30 KeV, and a current flow of from about $10^{-9}$ to about $10^{-6}$ amps. The beam is adapted to scan the target area at a fast rate, e.g. a dwell time of between about $10^{-3}$ and about $10^{-8}$ second. UV light exposure with a wavelength up to about 385 nm, e.g. 200–350 nm, an intensity of from about 1 mW to about 100 W for a dwell time of from about 0.1 second to about 10 minutes is also effective for polymerizing the polyacetylene cinnamate monomer to produce the magenta colored homopolymer. Equivalent dosages are employed for alternate sources of short wavelength exposures.

The resulting film is then subjected to a radiation source with energy emissions at a longer wavelength above 350 nm in the second stage of the reaction. The radiation source employed, preferably a laser source, is capable of generating heat sufficient to raise the temperature of the homopolymer in the exposed areas to between about 50° and about 150° C., preferably between about 60° and about 80° C., thus causing a permanent color change from magenta to yellow in the areas impinged by the laser emission in the second stage. In case (a) above, the laser source is employed in the writing mode to inscribe a predetermined permanent yellow image on the magenta colored homopolymer layer. In case (b) above, the laser source operating at the longer wavelength can be synchronized with the scribing device operating at the short wavelength and used in the writing mode to retrace a previously inscribed image or it can be used to expose the entire polymerized and non-polymerized portions of the diacetylene cinnamate layer so as to transmit a permanent yellow color to induce a chromic change to a permanent yellow color in the preinscribed magenta image. This operation is carried out under ambient pressure for a period sufficient to complete the color transition, which time period is dependent upon the laser beam power and type of laser imaging device selected The second stage heat generation can be supplied by substantially any laser generating energy in the 450 nm or longer wavelength regions of the spectrum. Such lasers include a compact semi-conductor diode, solid state, gas, metal vapor, or dye laser. However, semi-conductor diode lasers, having an output power of from about 1 microwatt to about 10 watts, are preferred. Specific examples of suitable lasers include GaAlAs, NaYtAl garnet, Ar, He-Ne, He-Cd, GaAs NeYAl garnet, ruby, NaYAg, krypton ion, copper vapor lasers, etc. Thus, crystalline, gas or amorphous solid, pulsed or continuous wave lasers may be used. For scribing, a laser beam diameter of 0.5 to about 2 nm with an exposure time of from about 180 to 250 ns/dot and an output of 2.5–3.5 mW is generally employed to create an image of high resolution.

The laser source selected should be capable of transmitting the desired heat needed to induce the chromic color change in the laser exposed areas of the homopolymerized diacetylene cinnamate layer at between about 350 and about 580 nm wavelength, which is within the absorption capability of the homopolymer. Alternatively, a laser transmitting energy at a higher wavelength, for example above about 350 up to about 1500 nm or higher can be employed, provided that a suitable energy absorbing, heat transmitting component, such as an energy absorbing polycarbocyanine dye, pyrylium dye, squarilium dye or a dye mixture or an intermixture as described in greater detail in copending U.S. patent application Ser. No. 07/601,537*, is used in conjunction with the diacetylene cinnamate to absorb energy from the laser and to transmit sufficient heat to the polymer so that a yellow image or pattern is inscribed thereon. The energy absorbing, heat transmitting agent is one having absorption capability in a wavelength similar to the transmitting laser and is capable of raising the temperature of the homopolymer to at least 50° C. When an energy absorbing dye is employed, the weight ratio of diacetylene cinnamate polymer to dye can vary between about 1000:and about 1:10, depending upon the amount of homopolymer present and the amount of radiation energy needed to be converted to heat energy. Most often the dye comprises between about 0.005 and about 10 wt. % of the imaging compound.

* by David F. Lewis, entitled LASER IMAGEABLE COMPOSITION and filed concurrently herewith In another embodiment of this invention, dual laser exposures can be effected with a single laser unit wherein a short in advance of a long wavelength energy generating laser is mounted. Because of the time lag in generating heat, as opposed to instantaneous polymerization, the laser emissions from the two beams, in synchronized phase, may be focused to impinge simultaneously on each pixel of the imageable layer for direct recording of a yellow image.

The resulting permanent yellow imaged film product supported on a transparent substrate can then be employed as a master film in the preparation of a printing plate or etch resist coated with a layer which is photosensitive to blue light transmission.

The image receptive device, e.g. an etch resist for a printed circuit board, a master printing plate, etc. can be composed of any durable support material such as metal, glass, ceramic, polyester, and the like which is coated with a photosensitive layer, comprised of any known photosensitive materials which undergo polymerization or a thermochromic change in response to radiation from a blue light source. Of these materials, colorless, thermochromic conjugated polyacetylenic monomers, their monomeric derivatives, diazo resins, cinnamic ester resins, polymethacrylates or a silver halide based film are suitable; however, crystalline, imageable diacetylene derivatives are preferred. Examples of preferred diacetylenic compounds comprising the photosensitive surface layer of the image receiving device include any of the art recognized hydrocarbon diacetylenes, and their derivatives such as the carboxyl, amino, amido, ester, ether, urea or carbamate substituted diacetylenes as well as tri- and tetra- acetylene derivatives of these species.

The homopolymerized diacetylene cinnamate of the present invention has other uses in addition to photoimaging. For example this homopolymer is useful as time-temperature or temperature indicator coatings as warming means for equipment which is subject to overheating. However, the photoimaging application of the homopolymer is emphasized since this product possesses unusual properties such as a permanent yellow thermochromic imaging and non-chemical development to images of superior resolution and intensity, which are so important in the photographic arts.

Having generally described the invention, reference is now had to the accompanying examples which are presented to illustrate preferred embodiments but which are not to be considered as limiting to the scope of this invention as is more broadly described above and in the appended claims.

EXAMPLE

A. Preparation of $[C_6H_5CH{=}CH{-}COOC_2H_4OCH_2C{\equiv}C{\rightarrow}_2$ Trans methyl cinnamate (324.4 g, 2 moles), 2-(propargyloxy) ethanol (200.1 g) and concentrated sulfuric acid (1 ml) were charged into a one-liter flask equipped with a mechanical stirrer, a thermometer, a nitrogen inlet and an adapter connected to a condenser. The solution was held at 110° C. over night under a flowing stream of nitrogen to remove methanol by-product. The remaining liquid was then vacuum distilled and a center cut of 280.7 g was collected at 147° C. and 0.01 mm Hg. The 2-(propargyloxy) ethanol product in 98% purity was recovered and identified by Ir and nmr analysis.

2-(Propargyloxy) ethanol (78.1 g), tetrahydrofuran (340 ml), tetramethyl ethylene diamine (20 g) and cuperous chloride (3 g) were charged into a one-liter flask. A stream of oxygen was bubbling through the solution with vigorous stirring for 11 hours at 40–45° C. The tetrahydrofuran solvent was then stripped off. The crude product was washed two times with 300 ml of 10% HCl solution and two times with water. After being dried in air, 72.5 g of 2-(propargyloxy) ethyl cinnamate, m.p. 47–50° C. was obtained. The structure of the chemical was identified by nmr and IR analyses.

B. Preparation of Coating Dispersion

In a glass container, 1.2 g. of the above product were dissolved at about 50° C. in 3.6 g. of ethyl acetate and the resulting solution was filtered and designated Solution A. A second solution, designated Solution B, was prepared by dissolving 1.2 g. of photographic gelatin and 0.05 g. of ALKANOL XC (an alcohol-containing wetting agent, supplied by E.I. duPont) in 30 g. of water. Solution B was heated to 60° C. and introduced into a 250 ml Waring Blender. While blending at high speed, Solution A was added to Solution B after which the blending was continued for 2 minutes. The resulting mixture was then poured into a crystallizing dish to chill set at about 12° C. The resulting gelled dispersion was then cut into approximately 1 cm cubes and allowed to warm in an air stream at approximately 32° C. to remove ethyl acetate by evaporation. After the ethyl acetate had been removed the gelled dispersion was reconstituted by melting at 40° C. and adding sufficient water to replace the weight loss that occurred during drying.

C. Coating a Film Base with Dispersion

The reconstituted dispersion was coated at about 8 micrometers thickness on a poly(ethylene terephthalate) film base which had been overcoated with a 1 micrometer thick layer of an adhesion promoting material composed of about 50 wt. % gelatin and 50 wt. % of a latex polymer. The coated film was then allowed to dry in air at ambient temperature.

D. Imaging the Film

A 4 ×4 inch sample of the above film was placed in a holding device over which is mounted a low pressure mercury arc lamp having a 100 watt output and emitting UV radiation at a maximum wavelength of about 253.7 nm. The colorless film is exposed for 0.second to emissions from the lamp so as to absorb energy and polymerize colorless $[C_6H_5{-}CH{=}CHCOOC_2H_4OCH_2C{\equiv}C{\rightarrow}_2{-}$ to a rich magenta homopolymer.

The resulting homopolymer is then scribed with a copper vapor laser having an output of 3 watts which transmits energy at about 560 nm wavelength and impinges discrete areas of the surface of the film defined by a series of diamond shaped figures and lines. The energy generated by this transmission is absorbed by the homopolymer and heats the exposed areas of the film to a temperature of about 65° C. in a fraction of a second whereby an image of said diamond shaped figures and lines is transmitted in high acuity in a permanent bright yellow color on the magenta background which is not exposed to the laser emissions.

E. Use of the Yellow Imaged Film as a Modulating Film

The above sample is employed as a modulating film in the following test. A blue light source, i.e. a high pressure mercury arc lamp operating at an output power of 1 kilowatt and transmitting energy in a wavelength of 350-450 nm is focused to scan the entire area of the film sample which is positioned about 3.6 feet from the light outlet. Contiguous with the surface of the film and on the surface directly opposite the surface being radiated, is positioned the imageable surface layer, i.e. 4-diazodiphenyl-amine/formaldehyde condensate, supported on cellulose triacetate sheet of the photoresist master printing plate.

The blue light from the lamp is absorbed in the imaged areas of the film sample and is transmitted from the non-imaged areas, in an exact negative imaged pattern to the imageable surface layer of the photoresist where it attacks the polymer condensate and renders the decomposed areas insoluble in water.

EXAMPLE 2

Example 1 is repeated except that in Part B, 0.1 wt. % of IR-125 dye (a polycarbocyanine dye supplied by Eastman Kodak) is added to solution B and a GaAlAs semiconductor diode laser with a wavelength of about 830 nm is substituted for the copper vapor laser in Part D. The image produced is one of high resolution defined in a bright yellow color on a magenta colored background.

EXAMPLE 3

Example 1 is repeated except that in part D, an electron beam writing device is used in place of the high pressure mercury arc lamp. The electron beam is used to instantly homopolymerize diacetylene and to write an image consisting of a series of lines by homopolymerizing the diacetylene cinnamate monomer in the corresponding discrete areas of exposure. The image is instantly visible as magenta lines on a colorless non-exposed monomer background. After about 1 hour, in the same manner, dots between the magenta lines are inscribed on the film with the electron beam scriber to provide a magenta image of lines and dots on the unexposed colorless background. Also in Part D, a broad exposure of the entire film is made with the copper vapor laser instead of impinging discrete areas. Within a fraction of a second the well defined image of the magenta lines and dots is transformed to a permanent bright yellow image.

It is to be understood that many modifications and substitutions can be made in the above examples without departing from the scope of this invention. For example, any of the other radiation devices which transmit energy in a short wavelength of 200-350 nm and/or any of the lasers which transmit energy in the longer wavelength above 350 nm can be substituted in the above examples in accordance with the teachings of this invention. Also any of the energy absorbing heat transmitting dyes including other polycarbocyamine dyes, squarilium or pyrilium dyes and dye complexes mentioned or described in copending U.S. patent application, Ser. No. 601,32, filed concurrently herewith, and in U.S. Pat. No. 4,513,071 which absorb energy in a wavelength similar to that of the energy generated from the laser can be substituted in the above examples or examples indicated by the above substitutions. Additionally, substitutions of other base films in Parts C and Parts E of the above examples or substituted examples, as well as other photoresist coatings for the image receiving device in Parts E can be made without departing from the scope of this invention.

What is claimed is:

1. The permanently and directly yellow-imageable composition containing the homopolymer of the diacetylene cinnamate having the formula $[C_6H_5-CH=CH-CO-PCH_2CH_2OCH_2-C\equiv C\frac{1}{2}]_2$ and between about 0.001 and about 10 wt. % of an energy absorbing, heat transferring agent having absorption in the wavelength range of from about 57 and about 1,500 nm.

2. The composition of claim 1 wherein said agent contains a polycarbocyanine dye as an active energy absorbing agent.

3. The composition of claim 1 wherein said agent contains a squarilium dye as an active energy absorbing agent.

* * * * *